United States Patent [19]
Fukunaga et al.

[11] Patent Number: 5,533,042
[45] Date of Patent: Jul. 2, 1996

[54] SEMICONDUCTOR LASER DEVICE AND DRIVING METHOD FOR THE SAME AS WELL AS TRACKING SERVO SYSTEM EMPLOYING THE SAME

[75] Inventors: Hideki Fukunaga; Kaoru Yasukawa; Hideo Nakayama; Nobuaki Ueki; Hiromi Otoma; Mario Fuse, all of Ebina, Japan

[73] Assignee: Fuji Xerox Co., Ltd., Japan

[21] Appl. No.: 317,594

[22] Filed: Oct. 3, 1994

[30] Foreign Application Priority Data

Oct. 12, 1993 [JP] Japan ................... 5-254433

[51] Int. Cl.⁶ .................. H01S 3/18; G11B 7/00
[52] U.S. Cl. .................. 372/50; 372/24; 369/44.14
[58] Field of Search .................. 372/50, 24, 38; 257/99, 784, 786; 369/44.14

[56] References Cited

U.S. PATENT DOCUMENTS

| | | | |
|---|---|---|---|
| 4,217,561 | 8/1980 | Scifres et al. | 372/24 |
| 4,219,785 | 8/1980 | Scifres et al. | 372/24 |
| 4,360,921 | 11/1982 | Scifres et al. | 372/24 |
| 4,461,007 | 7/1984 | Burhnam et al. | 372/50 |

FOREIGN PATENT DOCUMENTS

| | | |
|---|---|---|
| 58-55566 | 12/1983 | Japan. |
| 61-231786 | 10/1986 | Japan. |
| 61-236190 | 10/1986 | Japan. |
| 1-86691 | 7/1989 | Japan ................ 372/50 |
| 1-224933 | 9/1989 | Japan. |
| 2-263335 | 10/1990 | Japan. |
| 3-278490 | 12/1991 | Japan. |
| 5-13871 | 1/1993 | Japan ................ 372/50 |

OTHER PUBLICATIONS

Masanobu Watanabe et al., "Analysis of Lateral–Mode Behavior of Twin–Stripe Lasers Related To The Negative Slope In Their Current–Light Characteristics," *IEEE Journal of Quantum Electronics*, vol. QE–24, pp. 13–21, Jan. 1988.

D. R. Scifres et al., "Beam Scanning With Twin–Stripe Injection Lasers," *Appl. Phys. Lett.*, vol. 33, pp. 702–704, Oct. 1978.

*Primary Examiner*—Rodney B. Bovernick
*Assistant Examiner*—Robert McNutt
*Attorney, Agent, or Firm*—Oliff & Berridge

[57] ABSTRACT

A semiconductor laser device which allows high speed correction of the position of a laser spot on an optical disk is disclosed. The semiconductor laser device comprises an active layer which oscillates a laser beam when electric current is supplied thereto, and a plurality of independent electrodes for varying the current density distribution in the active layer to vary the intensity distribution of the laser beam to be emitted from an emergent face of the semiconductor laser device. With the semiconductor laser device, by supplying electric currents individually from the plurality of independent electrodes to vary the current density distribution in the active layer, the beam spot position can be corrected within the frequency bandwidth of several tens MHz by direct modulation of the semiconductor laser device. Also a driving method for the semiconductor laser device and a tracking servo system in which the semiconductor laser device is incorporated are disclosed.

16 Claims, 11 Drawing Sheets

SEMICONDUCTOR LASER DEVICE AND DRIVING METHOD FOR THE SAME AS WELL AS TRACKING SERVO SYSTEM EMPLOYING THE SAME

BACKGROUND OF THE INVENTION

1. Field of the Invention

This invention relates to a semiconductor laser device wherein the inrush current is controlled to move the beam position of a laser beam on an emergent face and a driving method for the semiconductor laser device as well as a tracking servo system for an optical disk apparatus wherein a semiconductor laser device is employed as a light source.

2. Description of the Related Art

In order to record information onto an optical disk or optically reproduce the thus recorded information, a laser beam emitted from an optical head must be irradiated at a precise position of a track on the optical disk. To this end, an optical disk apparatus is provided with a tracking servo system.

FIG. 10 schematically shows a tracking servo system of an optical disk apparatus disclosed in Japanese Patent Publication No. Sho 58-55566. A correction method in tracking of a conventional optical disk apparatus will be described subsequently with reference to FIG. 10.

Light emitted from a semiconductor laser 100 is reflected by a half mirror 107 and converged upon an optical disk 104 by a lens 102 fixed on a displaceable cell 103 to form a spot 106. Then, the light reflected from the optical disk 104 is detected by means of a detector 101 to detect a displacement from an object track, and the cell 103 is moved by a motor 109, which is controlled by a feedback circuit (not shown) in response to the thus detected displacement, by way of a bar member 108 interconnecting the motor 109 and the cell 103 to displace the lens 102 in a direction substantially perpendicular to the track to correct the position of the spot 106 on the optical disk 104.

In the tracking servo system, however, since the lens 102 is moved mechanically by the motor 109, the frequency band is limited to several kHz. Consequently, there is a problem in that the speed of rotation of the disk cannot be raised to raise the transfer rate of data.

Meanwhile, another tracking servo system which includes a variable wavelength laser and a diffraction grating is disclosed in Japanese Patent Laid-Open No. Hei 1-224933 or Japanese Patent Laid-Open No. Hei 2-263335.

In the tracking servo system just mentioned, laser light emitted from the variable wavelength laser is collimated once and then diffracted by the diffraction grating so that it is converged on an optical disk. In this instance, since the angle at which laser light is diffracted by the diffraction grating is varied by the wavelength of the laser light, the emergent angle of light from the diffraction grating can be varied by varying the wavelength of the laser to effect scanning of the laser beam on the face of the optical disk.

In the tracking servo systems disclosed in both of Japanese Patent Laid-Open Nos. Hei 1-224933 and 2263335, however, either the refraction index of a waveguide is varied to vary the wavelength or the diffraction grating is mechanically moved to effect scanning of the laser beam. Where the refraction index of the waveguide is varied, since the refraction index in the waveguide is varied readily by an environmental temperature variation or a temperature variation caused by internal heat generation, temperature control must be performed in order to control the wavelength of the variable wavelength laser. This results in the problem of an increase of the size of the tracking servo system. Further, since a diffraction grating is required, there is another problem in that the construction is complicated.

Further, a beam deflection laser wherein the emergent angle of a laser beam is varied is disclosed in Japanese Patent Laid-Open No. Sho 61-236190, No. Sho 61-231786 or No. Hei 3-278490.

The beam deflection laser is based on a twin stripe laser and includes two or more electrodes provided on a semiconductor laser such that the ratio between inrush currents from the electrodes are varied to promote the symmetry of the current density distribution in an active layer to vary the emergent angle of a laser beam. However, even if the emergent angle of the laser beam is varied, the position at which the laser beam is converged on an optical disk by a lens is not moved. Consequently, the beam deflection laser cannot be applied to a tracking system which is required to move a beam spot on an optical disk.

SUMMARY OF THE INVENTION

It is an object of the present invention to provide a semiconductor laser device and a driving method for the semiconductor laser device as well as a tracking servo system employing the semiconductor laser device by which the position of a beam spot on a disk can be corrected at a high speed.

In order to attain the object described above, according to an aspect of the present invention, there is provided a semiconductor laser device, which comprises an active layer for oscillating a laser beam when an electric current is supplied thereto, and a plurality of independent electrodes for varying the distribution in density of electric currents to be supplied to the active layer to vary the intensity distribution of the laser beam to be emitted from an emergent face of the semiconductor laser device.

The plurality of independent electrodes may vary the current density distribution in the active layer in a lateral direction perpendicular to an emerging direction of laser light from the semiconductor laser device to vary the intensity distribution of the laser light in the lateral direction.

The plurality of independent electrodes may be formed as stripes extending in an emerging direction of laser light from the semiconductor device from a front end face to a rear end face of the semiconductor laser device.

In the semiconductor laser device, the plurality of independent electrodes are driven to vary the current density distribution in the active layer to vary the intensity distribution of the laser beam to be emitted from the emergent face of the semiconductor laser device. Consequently, the position of a laser spot can be corrected with the frequency bandwidth of several tens MHz by direct modulation of the semiconductor laser device without the necessity of any mechanical movement.

According to another aspect of the present invention, there is provided a semiconductor laser device, which comprises a semiconductor substrate, a plurality of semiconductor layers including a first clad layer of a first conduction type, an active layer, a second clad layer of a second conduction type and a contact layer of the second conduction type successively layered on the semiconductor substrate, and a plurality of independent electrodes for varying the current density distribution in the active layer in a lateral direction perpendicular to an emerging direction of laser light from the semiconductor laser device and parallel to the semiconductor layers to vary the intensity distribution of the laser light in the lateral direction.

In the semiconductor laser device, the plurality of independent electrodes are driven to vary the current density distribution in the active layer to vary the intensity distribution of the laser beam to be emitted from the emergent face of the semiconductor laser device. Consequently, the position of a laser spot can be corrected with the frequency bandwidth of several tens MHz by direct modulation of the semiconductor laser device without the necessity of any mechanical movement.

Thus, the semiconductor laser device may be driven by a method which comprises the step of supplying electric currents individually from the plurality of independent electrodes formed on the contact layer to vary the current density distribution in the active layer. In this instance, the driving method may comprise the steps of supplying electric currents individually from the electrodes so that a light emitting area in which the current density exhibits its maximum to oscillate a laser beam may be formed in the active layer, and continuously varying the electric currents to be supplied to the electrodes to continuously move the light emitting area to move the beam position of the laser beam in a lateral direction.

The semiconductor laser device may further comprise an insulator film covering the contact layer and the electrodes and having a plurality of windows perforated therein in partial register with the electrodes, and a plurality of wiring lines formed on the insulator film for individually supplying electric currents to the electrodes therethrough, the electrodes and the wiring lines being connected to each other in the windows of the insulator film. In this instance, the plurality of independent electrodes may be formed as stripes extending in the light emerging direction from a front end face to a rear end face of the semiconductor laser device. In this instance, the semiconductor laser device may be driven by a driving method which comprises the step of controlling the electric currents to be supplied from the striped electrodes to continuously vary the electric currents to be supplied from the electrodes from a condition wherein a laser beam is oscillated at a particular position to continuously move the beam position of the laser beam on the emergent face of the semiconductor laser device.

According to a further aspect of the present invention, there is provided a tracking servo system, which comprises a laser source for generating a laser beam to be irradiated upon an optical disk which has information tracks stored in the form of optically detectable markers thereon, a beam direction apparatus for directing the laser beam from the laser source along a beam path to an object location of the optical disk which includes an object one of the information tracks and a pair of non-recorded areas between the object information track and adjacent ones of the information tracks on the opposite sides of the object information track, an objective lens for converging the laser beam directed by the beam direction apparatus upon the object location of the optical disk and receiving the beam reflected from the object location, a photo-detector for receiving and converting the reflected beam into an electric signal, and a laser driving apparatus for controlling the electric current to be supplied to the laser source in response to the electric signal from the photo-detector, the laser source being a semiconductor device including an active layer for oscillating a laser beam when an electric current is supplied thereto, and a plurality of independent electrodes for varying the distribution in density of electric currents to be supplied to the active layer to vary the intensity distribution of the laser beam to be emitted from an emergent face of the semiconductor laser device.

With the semiconductor laser device and the tracking servo system according to the present invention, since the peak position of the laser beam on the emergent face of the semiconductor laser device can be moved by varying the distribution of electric currents to be supplied to the active layer of the semiconductor laser device, where the tracking servo system is accommodated in an optical disk apparatus, the position of the beam on an optical disk can be corrected to effect tracking while a lens for converging the laser beam upon the disk is fixed.

Further, since the movement of the beam position can be performed by direct modulation of the semiconductor laser device, a high speed operation can be performed, and data transfer can be performed at a high rate.

Furthermore, since the lens for converging the laser beam upon the optical disk can be kept fixed, a motor for moving the lens is not necessary, and consequently, the tracking servo system can be reduced in size.

In addition, while conventional mechanical tracking allows correction of the position of a laser beam with the frequency bandwidth of several kHz, the tracking servo system allows tracking with the frequency bandwidth of several tens MHz. Consequently, the data transfer rate of an optical medium can be enhanced remarkably.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENT

Figure 1:
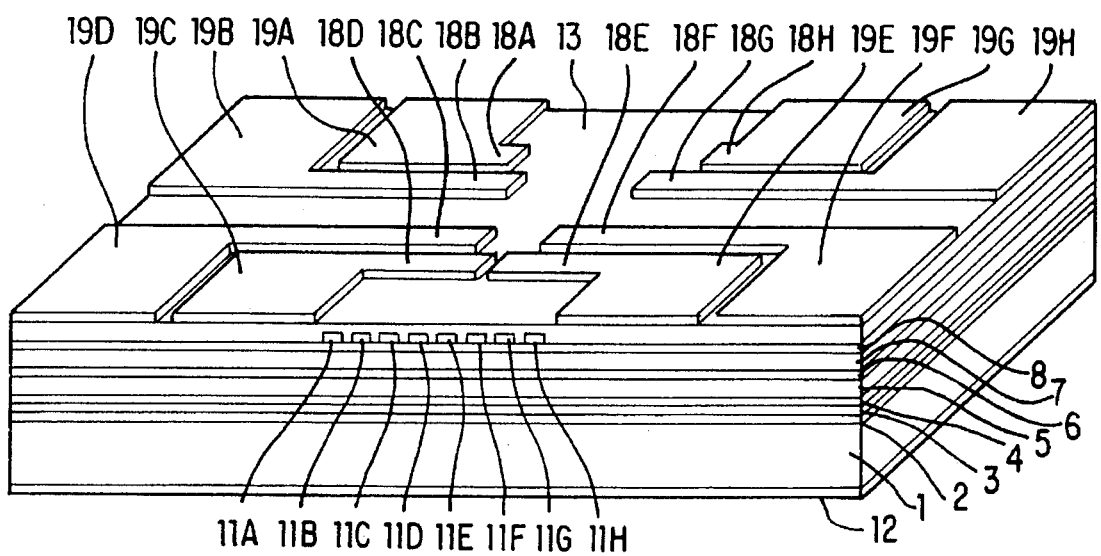
FIG. 1 is a schematic perspective view of a semiconductor laser device to which the present invention is applied.

Referring first to FIG. 1, there is shown a semiconductor laser device to which the present invention is applied. The semiconductor laser device shown includes an n-type GaAs substrate 1, an n-type GaAs first buffer layer 2, an n-type $Al_{0.2}Ga_{0.8}As$ second buffer layer 3, an n-type $Al_{0.4}Ga_{0.6}As$ third buffer layer 4, an n-type $Al_{0.6}Ga_{0.4}As$ first clad layer 5, a quantum well active layer 6, a p-type $Al_{0.6}Ga_{0.4}As$ second clad layer 7, a p-type GaAs contact layer 8, striped p-side electrodes 11A to 11H, an n-side electrode 12, an insulator film 13, bonding pads 19A to 19H for bonding wires (not shown) for supplying electric currents therethrough, and wiring lines 18A to 18H for interconnecting the striped p-side electrodes 11A to 11H and the bonding pads 19A to 19H, respectively.

In the semiconductor laser device, electric currents supplied from the wires flow from the bonding pads 19A to 19H past the wiring lines 18A to 18H, respectively, to the striped p-side electrodes 11A to 11H, respectively, and then supplied into the active layer 6 to cause laser oscillations. In this instance, the beam position of a laser beam to be emitted can be moved by controlling the current amounts to flow through the striped p-side electrodes 11A to 11H.

Subsequently, a process of manufacturing the semiconductor laser device described above will be described with reference to FIGS. 2A to 5C.

Figure 2A:
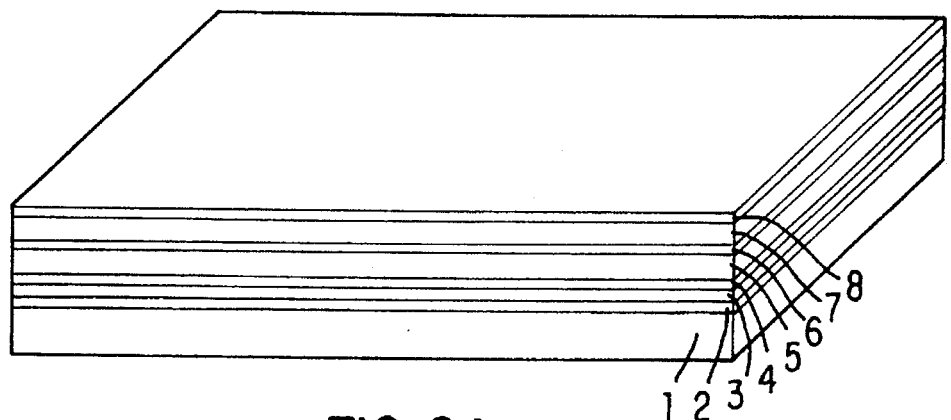
FIGS. 2A to 2C, 3A to 3C, 4A to 4C and 5A to 5C are schematic perspective views showing different successive steps of a process of manufacturing the semiconductor laser device shown in FIG. 1.

First, as shown in FIG. 2A, semiconductor layers including a first buffer layer 2 of 0.1 m thick made of GaAs doped with Se, a second buffer layer 3 of 0.1 m thick made of $Al_{0.2}Ga_{0.8}As$ doped with Se, a third buffer layer 4 of 0.1 m thick made of $Al_{0.4}Ga_{0.6}As$ doped with Se, a first clad layer 5 of 1 m thick made of $Al_{0.6}Ga_{0.4}As$ doped with Se, an undoped quantum well active layer 6, a second clad layer 7 of 1 m thick made of $Al_{0.6}Ga_{0.4}As$ doped with Mg and a contact layer 8 of 0.1 m thick made of GaAs doped with Mg are successively layered by an MOCVD method on a GaAs substrate 1 doped with Si.

The undoped quantum well active layer 6 has a double quantum well structure wherein a barrier layer of 5 nm thick made of undoped $Al_{0.3}Ga_{0.7}As$ is held between a pair of well layers of 10 nm thick made of undoped GaAs and a pair of waveguide layers of 0.1 m thick made of undoped $Al_{0.3}Ga_{0.7}As$ are formed on the opposite outer faces of the well layers.

Figure 2B:
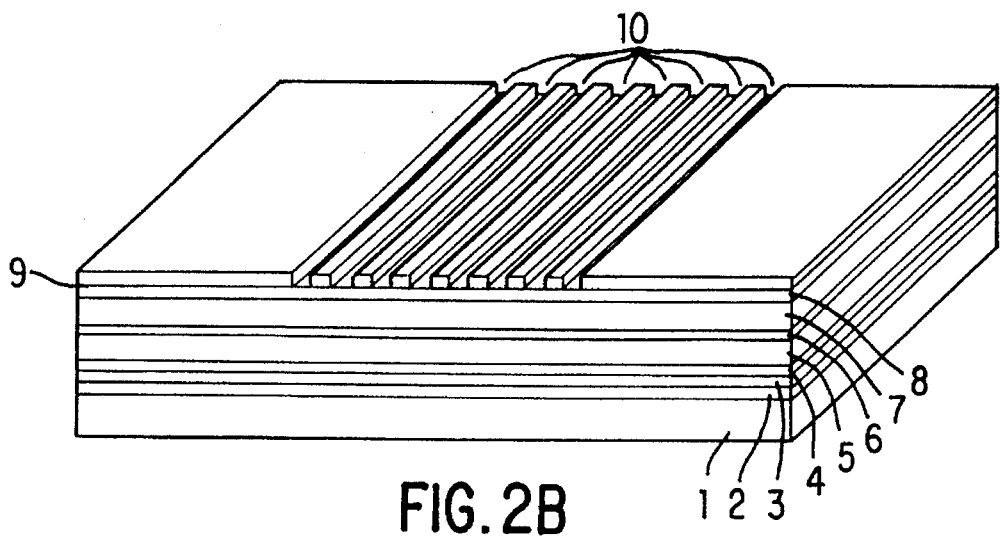

A photo-resist layer 9 is formed on the top of the semiconductor layers, and eight striped windows 10 are formed by photo-lithography in the photo-resist layer 9 such that the stripes have a width of 0.5 to 10 m and are spaced by 0.5 to 5 m from each other as shown in FIG. 2B.

Figure 2C:
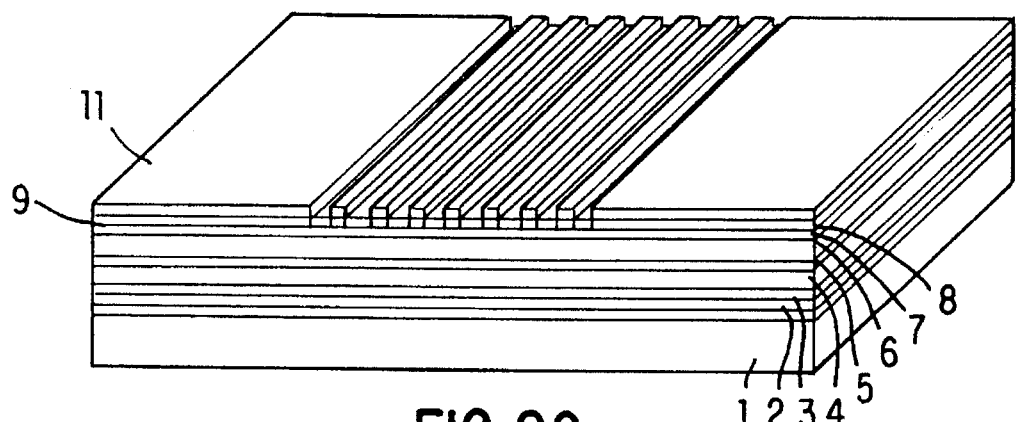
Figure 3A:
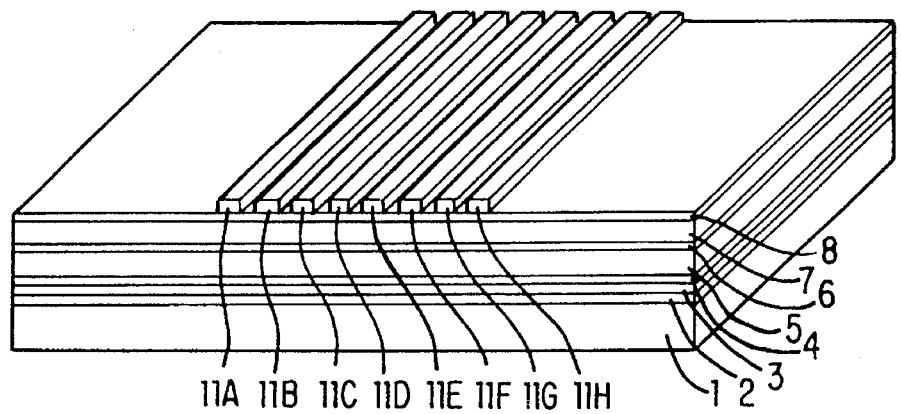

Subsequently, a p-side electrode 11 is deposited with the depth of 50 to 100 nm on the entire face by vapor deposition as seen in FIG. 2C, and then the photo-resist layer 9 is removed to remove the p-side electrode 11 on the photo-resist layer 9 by liftoff to form p-side striped electrodes 11A to 11H of 0.5 to 10 m stripe width in a spaced relationship from each other by 0.5 to 5 m as seen in FIG. 3A.

Figure 3B:
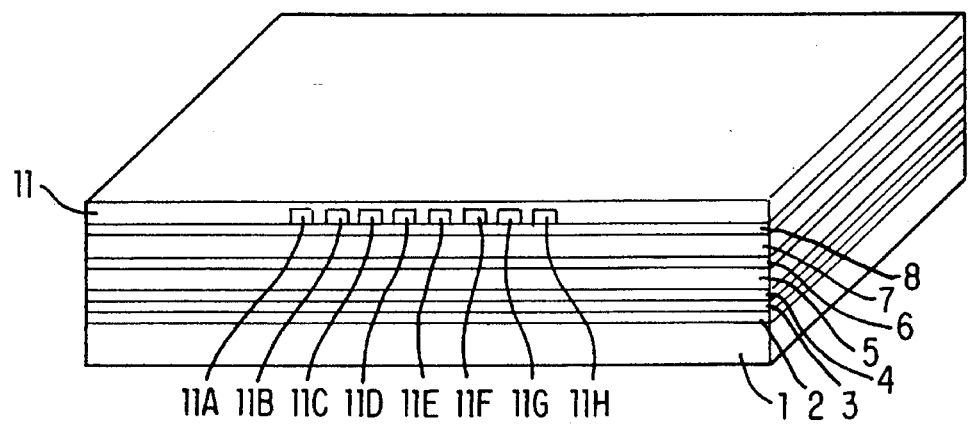

Subsequently, a $Si_3N_4$ film 13 as an insulator film is formed with the thickness of 200 nm on the entire face by sputtering as shown in FIG. 3B.

Figure 3C:
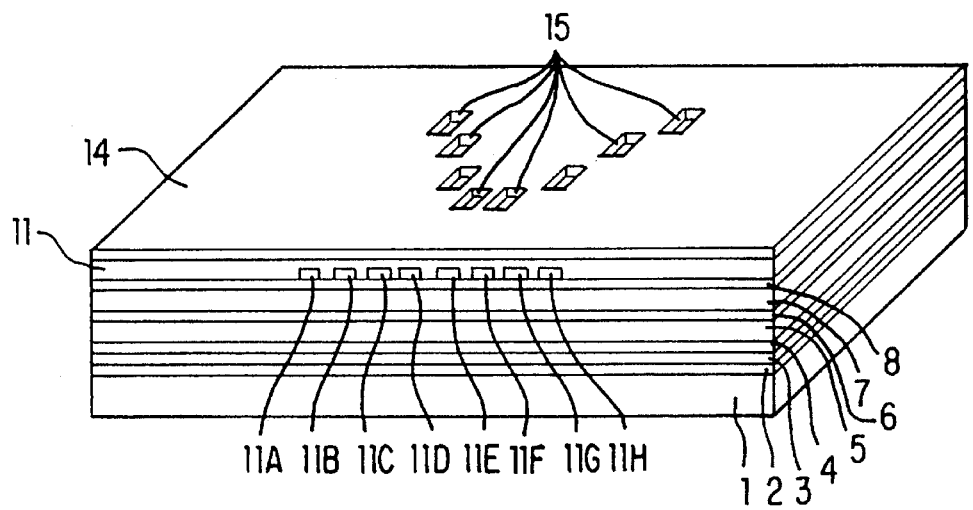

Then, windows 15 of 1 to 50 m long in the direction of the stripes of the p-side electrodes 11A to 11H and of 0.5 to 10 m wide in a direction perpendicular to the stripes are formed in a photo-resist layer 14 above the p-side striped electrodes 11A to 11H by photo-lithography as shown in FIG. 3C.

Figure 4A:
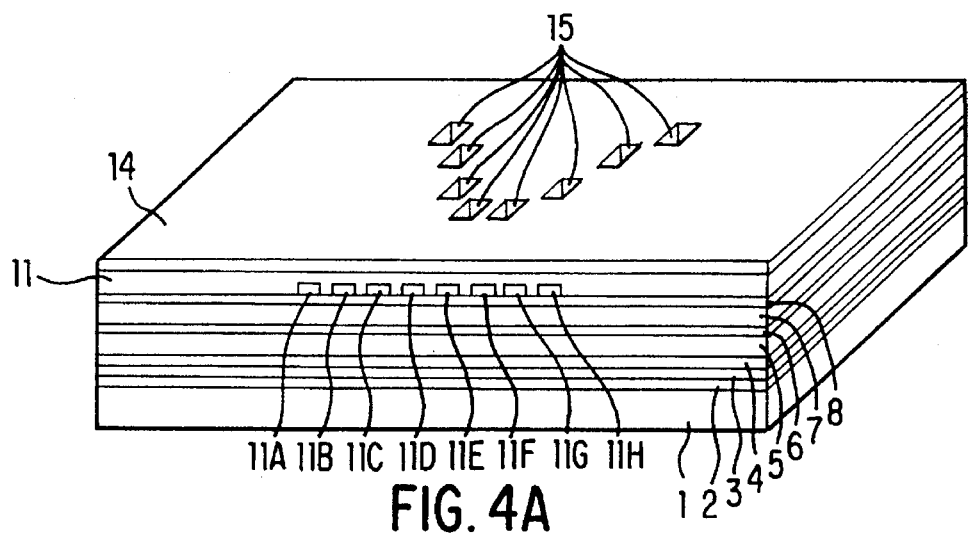

Thereafter, the $Si_3N_4$ film 13 is etched with buffered hydrofluoric acid using the photo-resist layer 14 as a mask to form windows 16A to 16H in the $Si_3N_4$ film 13 as shown in FIG. 4A.

Figure 4B:
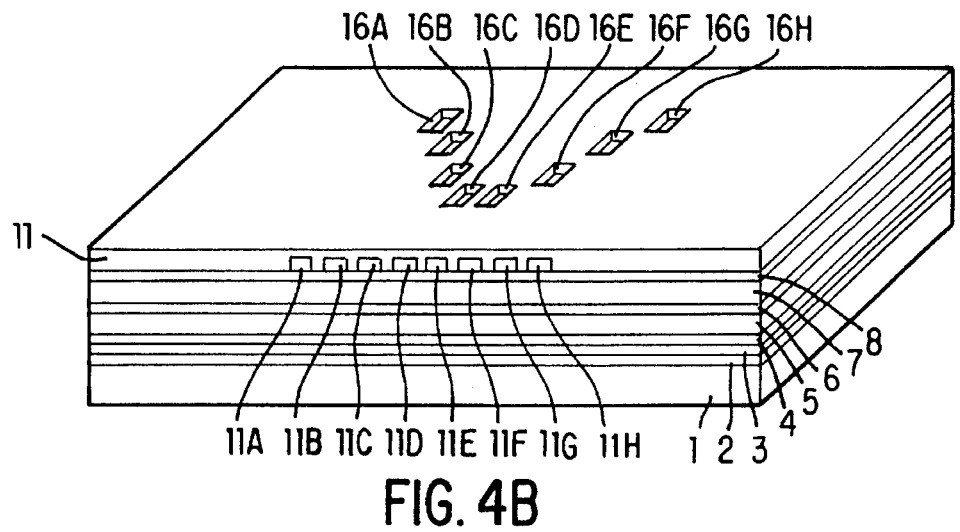
Figure 4C:
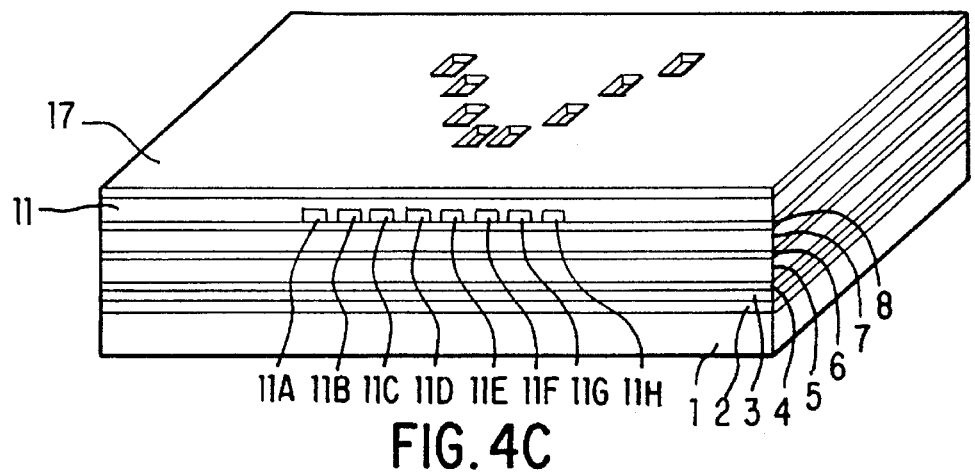

Subsequently, the photo-resist layer 14 is removed as shown in FIG. 4B, and a wiring electrode 17 is deposited with the thickness of 100 to 1,000 nm over the entire face by vapor deposition as shown in FIG. 4C.

Figure 5A:
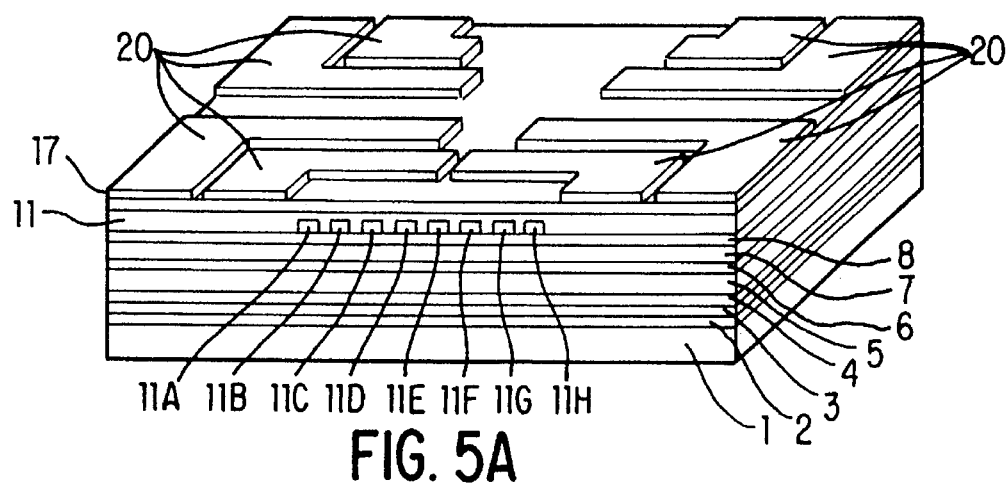
Figure 5B:
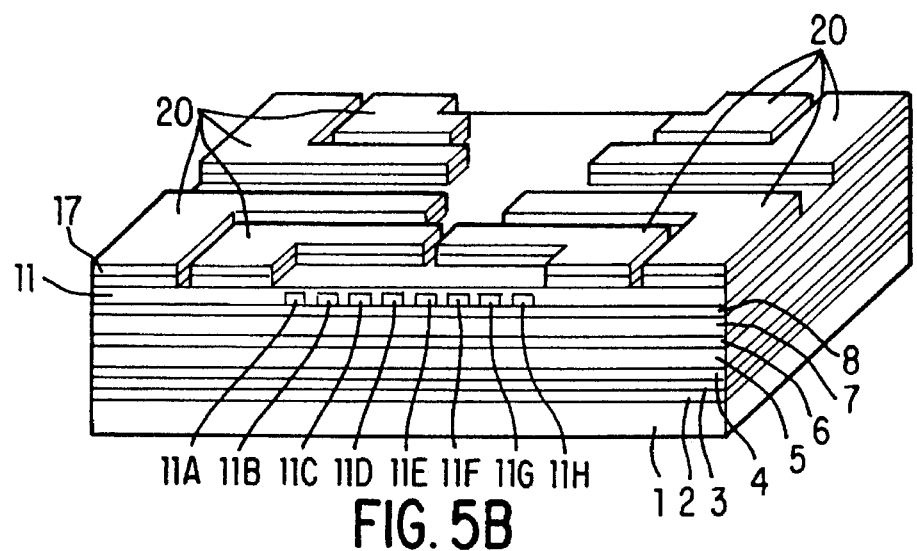

Then, patterns of wiring lines 18A to 18H and wire bonding pads 19A to 19H are formed from a photoresist layer 20 by photo-lithography as shown in FIG. 5A, and then the wiring electrode 17 is etched using the photo-resist layer 19 as a mask as shown in FIG. 5B.

Figure 5C:
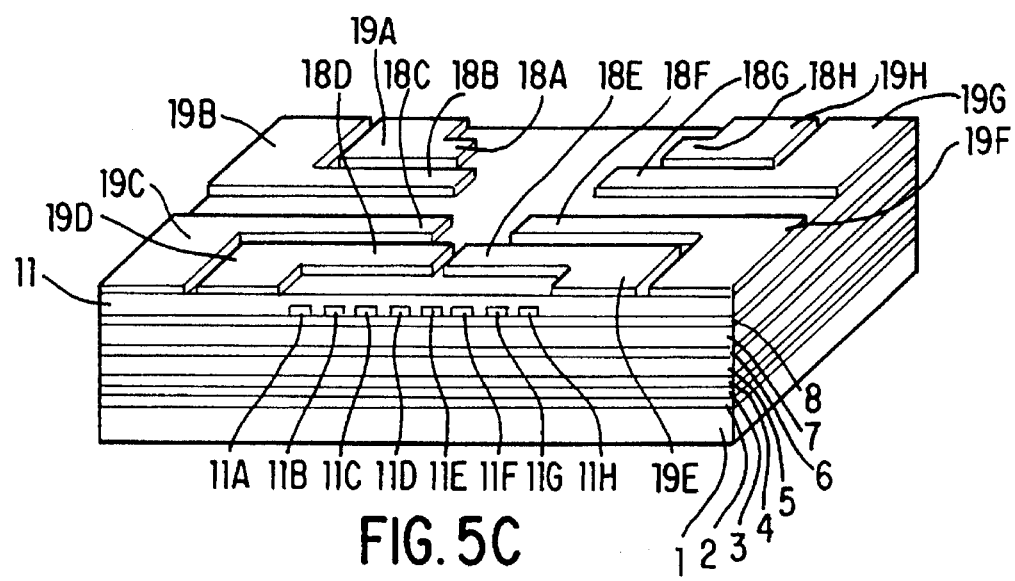

Thereafter, the photo-resist layer 19 is removed to leave the wiring lines 18A to 18H and the wire bonding pads 19A to 19H as shown in FIG. 5C. Then, the GaAs substrate 1 is polished to the thickness of 100 m, and an n-side electrode 12 is deposited on the GaAs substrate 1 by vapor deposition, thereby forming the semiconductor laser device shown in FIG. 1.

It is to be noted that the semiconductor laser device of the present invention may be formed from other semiconductor compositions than those employed in the embodiment described above. For example, it may be formed from an AlGaInP mixed crystal material, a GaInAsP mixed crystal material, an AlInAsP mixed crystal material, a ZnSSe mixed crystal material or a CdZnSSe mixed crystal material. Here, for the p-side electrodes 11A to 11H, the wiring lines 18A to 18H and the wire bonding pads 19A to 19H, one of Au, AuZn, Cr, Ti and Pt or a suitable combination of them is used. Meanwhile, for the n-side electrode 12, one of Au, AuGe and Ni or a suitable combination of them is used. Further, while a $Si_3N_4$ film is employed as an insulator film here, a dielectric film such as a $SiO_2$ film or an $Al_2O_3$ film may be employed instead.

Figure 6:
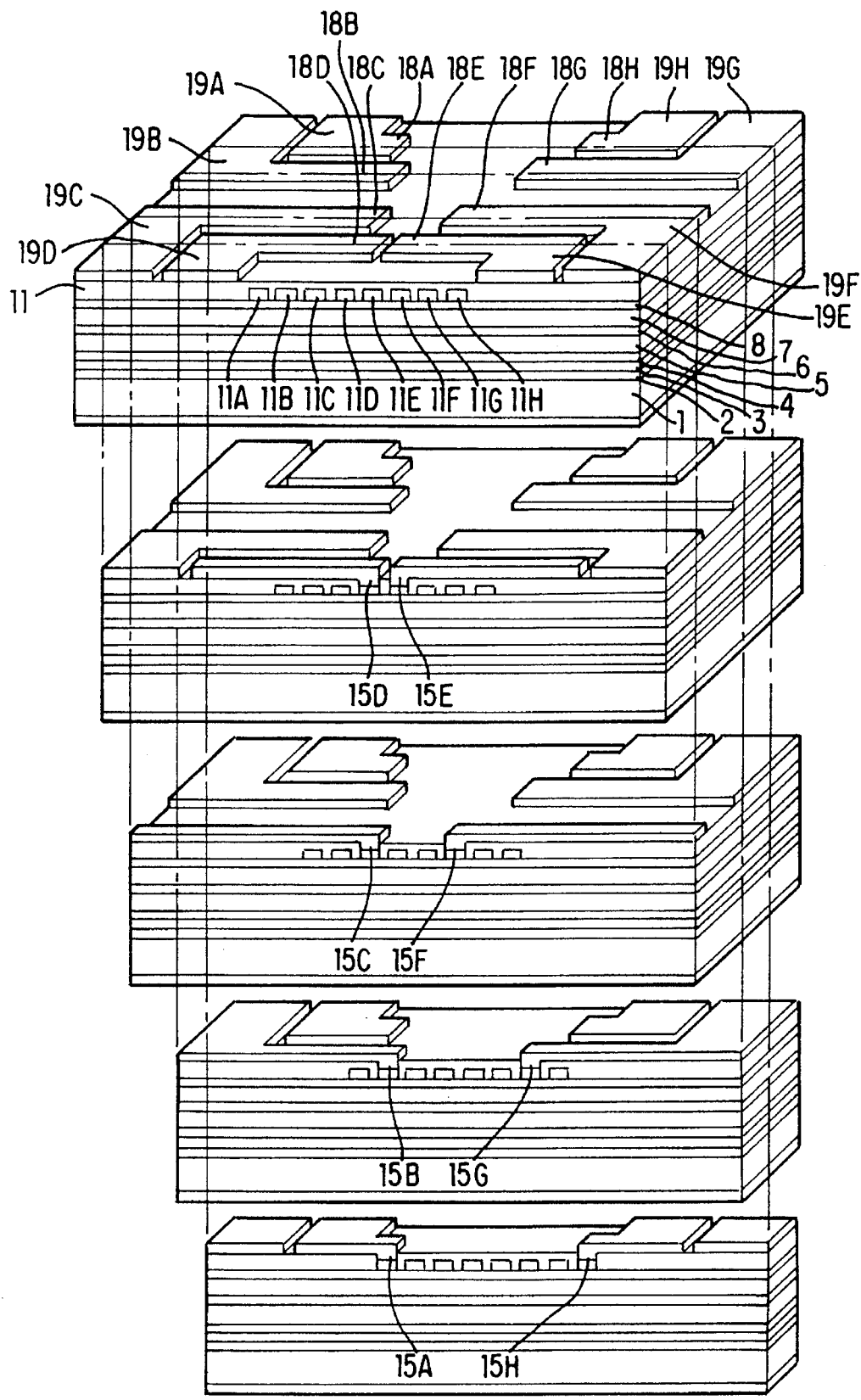
FIG. 6 is a fragmentary sectional view of the semiconductor laser device shown in FIG. 1.

FIG. 6 shows cross sections of the semiconductor laser device formed in such a manner as described above.

As clearly seen from FIG. 6, the p-type striped electrodes 11A to 11H are wired through the windows 15A to 15H independently of the wiring lines 18A to 18H and are connected to the wire bonding pads 19A to 19H, respectively. Consequently, electric currents can be supplied to the striped electrodes 11A to 11H independently of one another.

Figure 7:
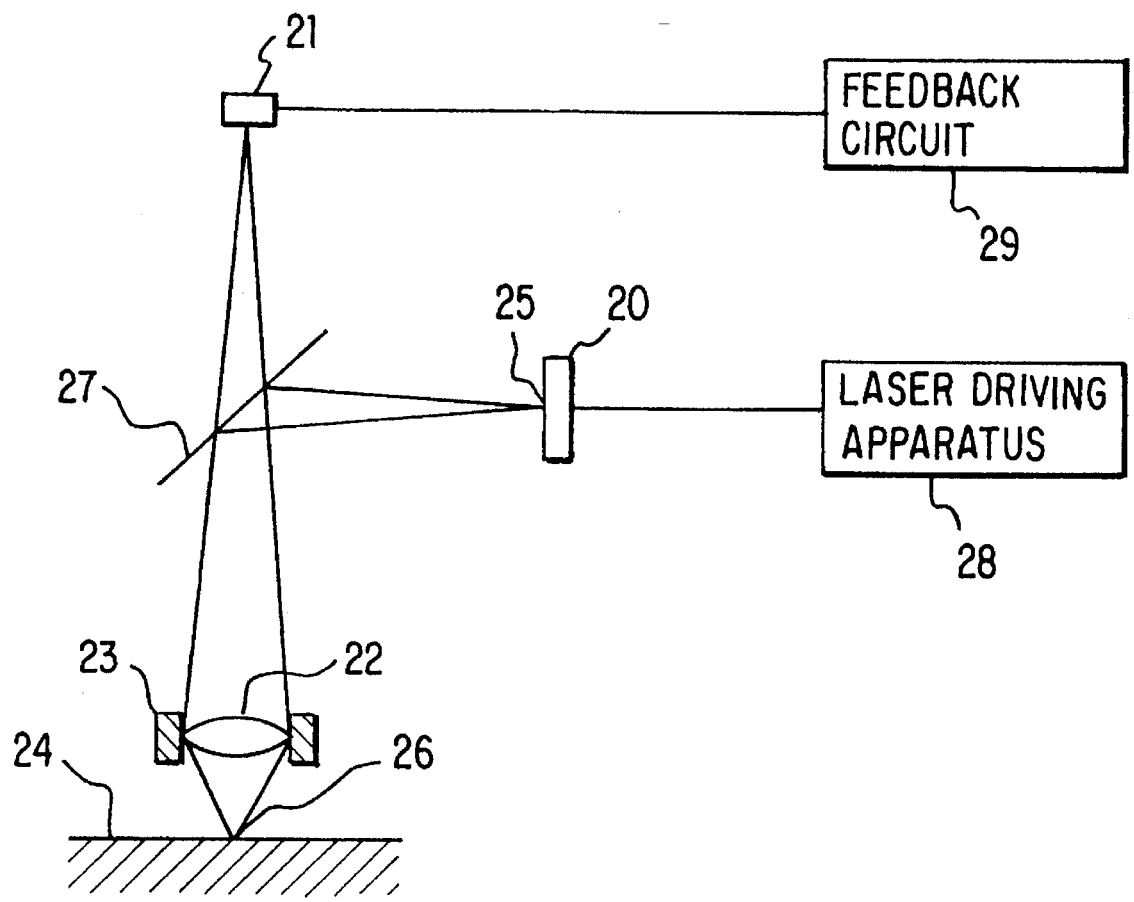
FIG. 7 is a schematic diagrammatic view showing a tracking mechanism for an optical disk apparatus in which the semiconductor laser device shown in FIG. 1 is incorporated.

FIG. 7 shows a tracking servo system for an optical disk apparatus which employs the semiconductor laser device described above.

Referring to FIG. 7, the tracking servo system shown includes a semiconductor laser 20 for generating a laser beam to be irradiated upon an optical disk 24 which has information tracks (not shown) stored in the form of optically detectable markers thereon. The semiconductor laser device described above is employed as the semiconductor laser 20. The tracking servo system further includes a half mirror 27 serving as a beam direction apparatus which directs the laser beam incident thereto along a beam path from the semiconductor laser 20 to a particular location which covers an object information track and a pair of non-recorded areas between the object information track and adjacent tracks, an objective lens 22 for converging the laser beam directed by the half mirror 27 to the particular location mentioned above and receiving the beam reflected from the location, a lens fixing cell 23 for holding the objective lens 22 thereon, a photo-detector 21 for receiving and converting the reflected beam into an electric signal, a laser driving apparatus 28 for controlling the current to be supplied to the semiconductor laser 20 in response to the electric signal from the photo-detector 21, and a feedback circuit 29.

In the tracking servo system, light emitted from the semiconductor laser 20 is reflected by the half mirror 27 and converged upon the optical disk 24 by the fixed lens 22, and then, the light reflected from the optical disk 24 is detected by means of the photo-detector 21 to detect a displacement of a spot of the light from an object track.

Then, the inrush current to the semiconductor laser 20 is controlled by the feedback circuit 29 to vary the distribution of densities of electric currents supplied to the active layer 6 to vary the intensity distribution of the laser light emitted from the emergent face of the semiconductor laser 20 thereby to move the position of the laser beam 25 to correct the position of the spot 26 on the optical disk 24.

In the present system, since the gain area within which laser oscillations occur is formed by direction modulation of the semiconductor laser to correct the position of the beam spot, the frequency bandwidth reaches several tens MHz, which allows an increase of the transfer rate of data.

Further, a method of varying the current density distribution in the active layer 6 to move the position of the laser beam on the emergent face of the semiconductor laser will be described in detail with reference to FIGS. 8 and 9.

Figure 8A:
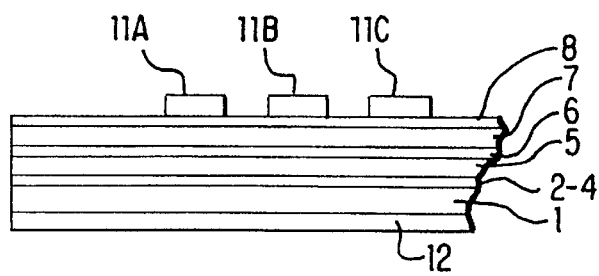
FIG. 8 is a diagrammatic view illustrating a principle in which the position of a beam spot by the semiconductor laser device shown in FIG. 1 is moved.
Figure 8B:
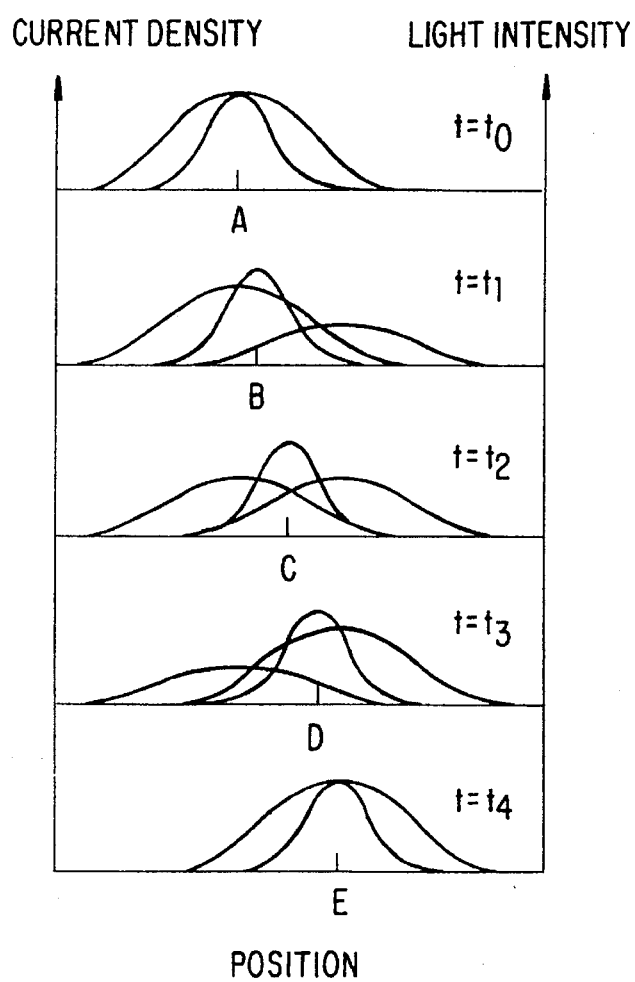
Figure 8C:
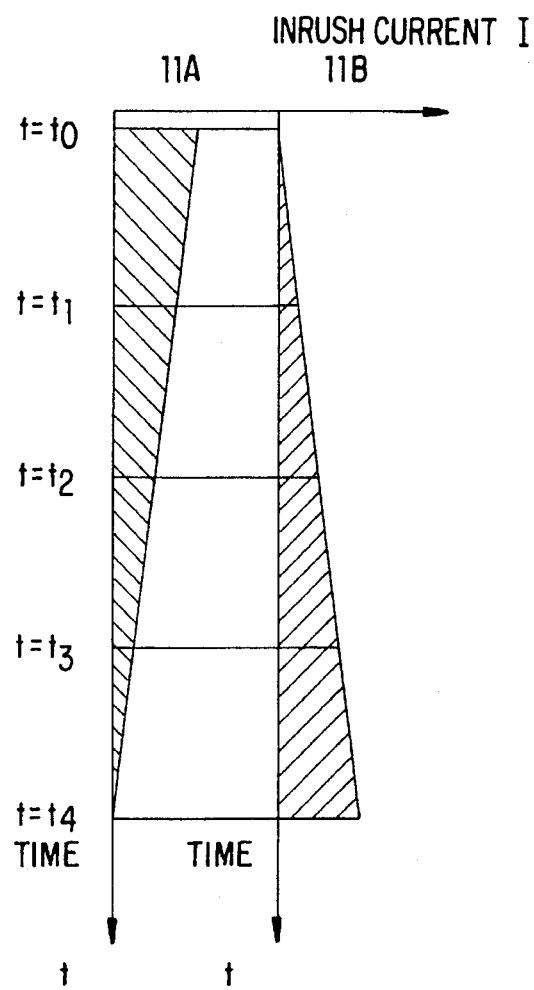

FIG. 8 illustrates an electric current supplying method for moving the beam position by means of two electrodes in the semiconductor laser, in which a plurality of striped electrodes 11 for supplying electric currents into the active layer are formed such that they extend in a light emerging direction, where the electrodes have a width of 3 m or more and the distance between the electrodes is as great as 2 m or more.

First, at $t=t_0$, an electric current higher than an oscillation threshold level current of the laser is supplied from the electrode 11A. Thereupon, the current density in the active layer 6 presents such a distribution as indicated by a thin solid line curve while the light on the emergent face of the semiconductor laser exhibits such a distribution as indicated by a thick line curve. Thus, the beam position coincides with a peak position a of the current density.

Then, when an electric current is supplied from the electrode 11B while the inrush current from the electrode 11A is decreased as seen from the diagram of FIG. 8, the current densities supplied from the electrodes 11A and 11B individually exhibit such distributions as indicated by thin line curves. Since the actual current density distribution in the active layer 6 is a superposition of the two curves, the peak position of the current density moves toward the electrode 11B side, and at $t=t_1$, also the beam position moves from the position toward the electrode B side to another position b.

As the inrush current from the electrode 11A is further decreased and the inrush current from the electrode 11B is further increased, the beam position moves from the position b at $t=t_1$ successively to positions c and d at $t=t_2$ and $t_3$ and finally to a position e at which only the inrush current from the electrode 11B remains supplied. By controlling the inrush currents from the electrode C and the plurality of electrodes juxtaposed in parallel to the electrode 11C in a similar manner, the beam position can be moved continuously.

Figure 11:
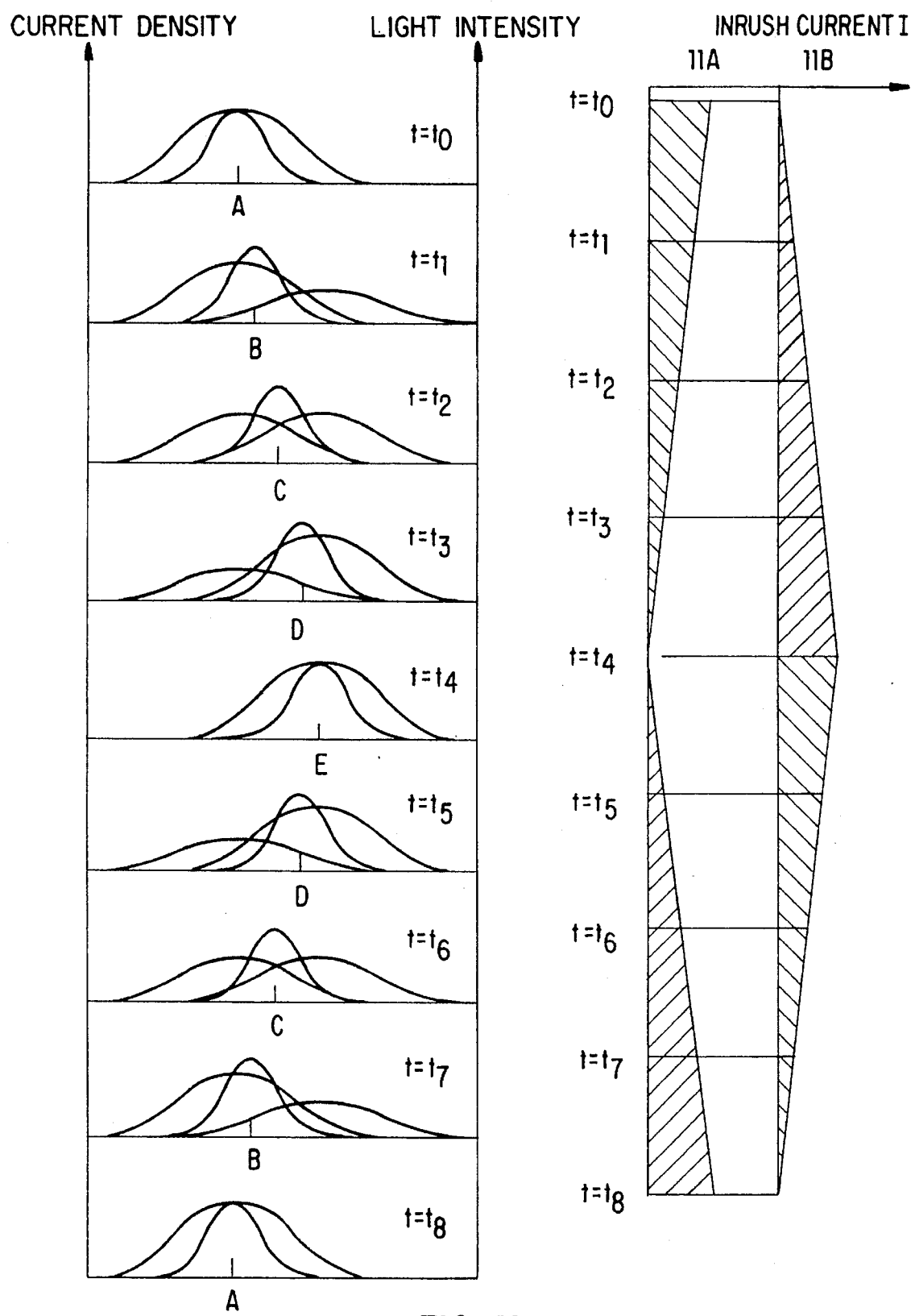
FIG. 11 is a diagrammatic view illustrating a further principle in which the position of a beam spot by the semiconductor laser device shown in FIG. 1 is moved.

It is to be noted that, upon tracking, the beam position must be varied while the laser beam is irradiated continuously, and the current density is varied between a plurality of electrodes with respect to time. FIG. 11 illustrates the movement of the beam position when the beam spot is moved back and forth in parallel. In particular, after the control illustrated in FIG. 8, the inrush current from the electrode 11A is increased from $t_4$ to $t_8$ while the inrush current from the electrode 11B is decreased from $t_4$ to $t_8$ to return the beam position to its original position. Upon tracking, in order to obtain a desired beam position, the electric current value is varied continuously as seen in FIGS. 8 and 11. If the inrush current is applied in the form of pulses, then the laser beam is oscillated intermittently, which is not desirable for tracking. It is to be noted that the variations with respect to time illustrated in FIGS. 8 and 11 do not have any influence upon the follow-up speed of the beam.

Figure 9A:
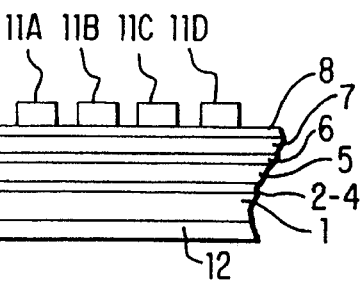
FIG. 9 is a similar view but illustrating another principle in which the position of a beam spot by the semiconductor laser device shown in FIG. 1 is moved.
Figure 9B:
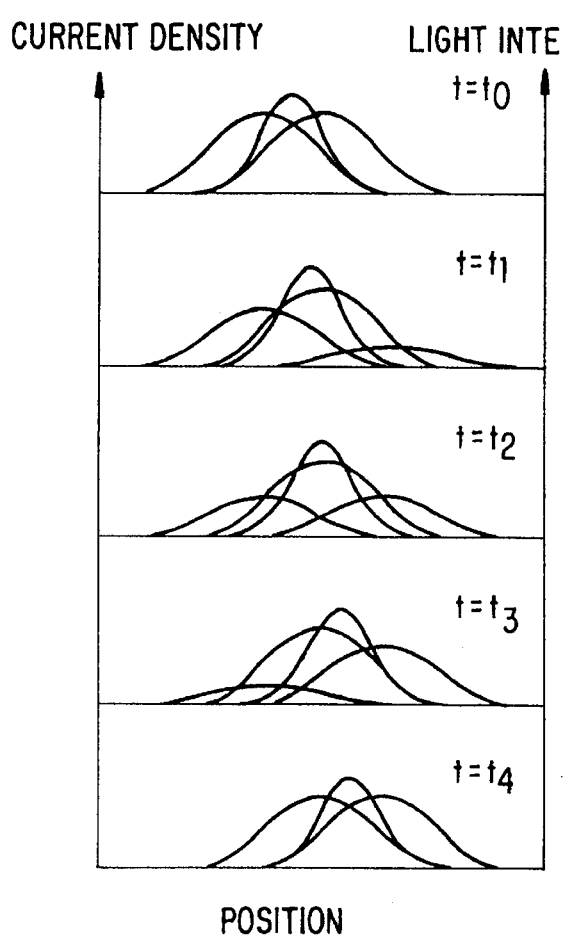
Figure 9C:
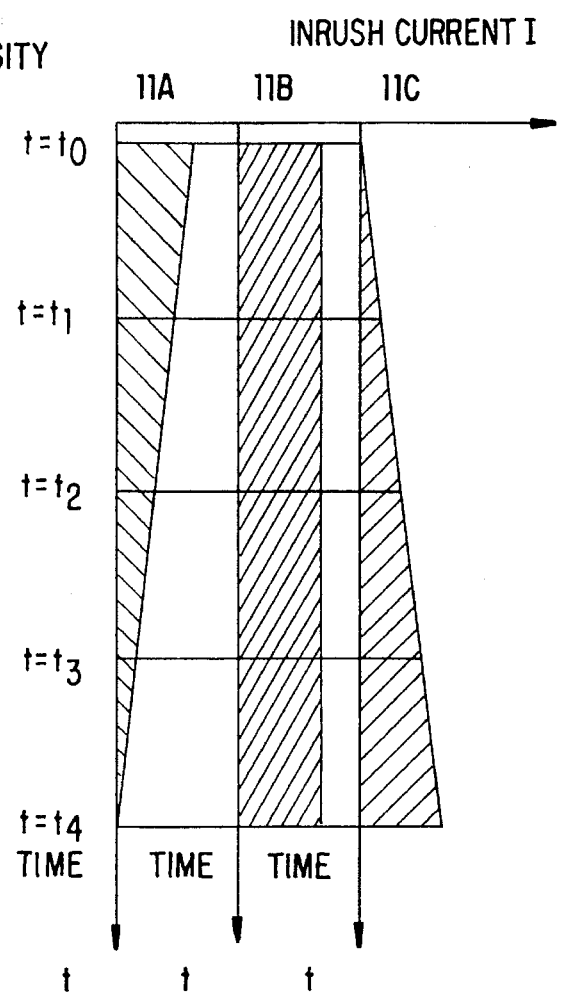
Figure 10:
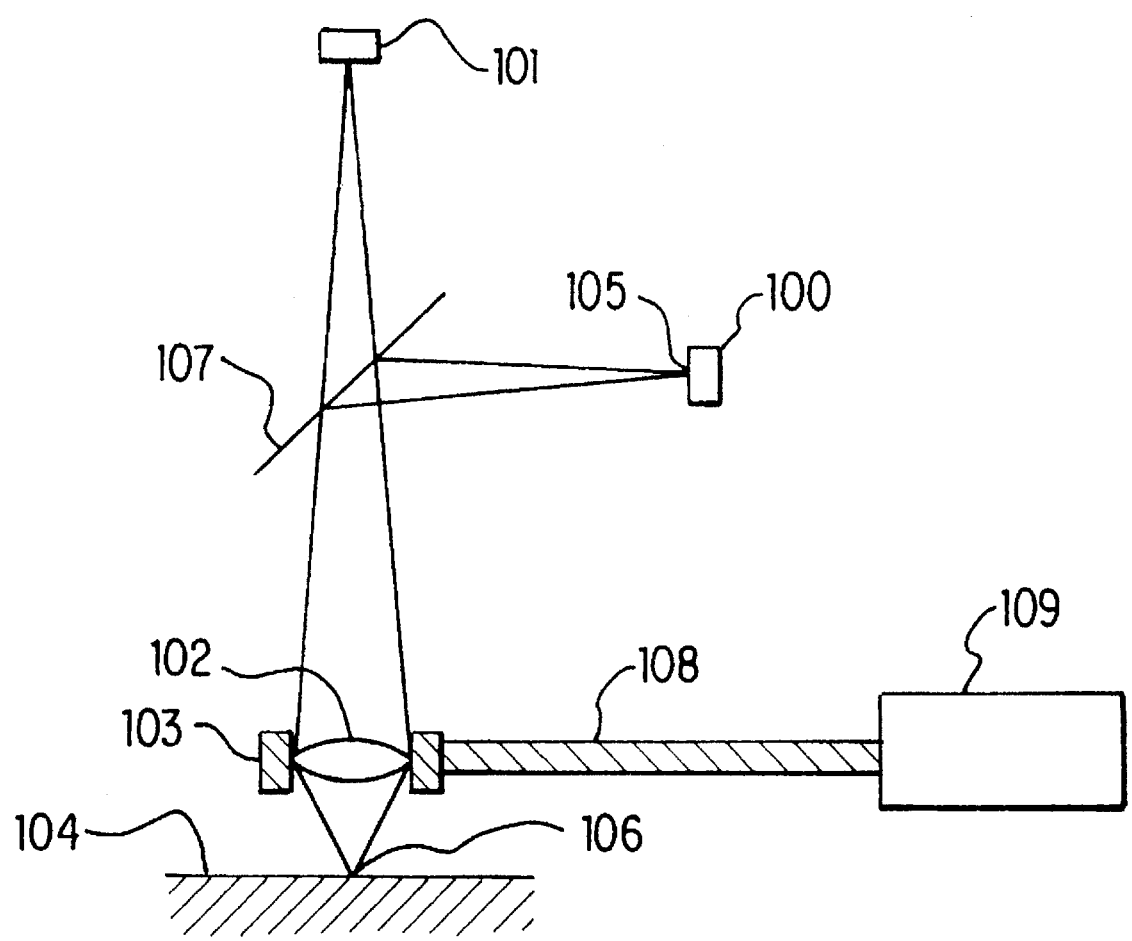
FIG. 10 is a conventional tracking mechanism for an optical disk apparatus.

FIG. 9 illustrates an electric current supplying method wherein the beam position is moved by three electrodes where the electrode width is 3 m or less and the distance between the electrodes is as small as 2 m or less.

As seen from the diagram of FIG. 9, at $t=t_0$, equal currents are supplied from the electrodes 11A and 11B so that the beam position may be intermediate between the electrodes 11A and 11B. Thereafter, at $t=t_1$, to $t_4$, the current to be supplied from the electrode 11A is decreased and simultaneously the electric current to be supplied from the electrode 11C is increased while the electric current to be supplied from the electrode 11B is kept fixed.

Consequently, the densities of the electric currents supplied from the electrodes 11A, 11B and 11C exhibit such distributions in the active layer 6 as indicated by thin line curves in FIG. 9, and the actual current density distribution is a superposition of the thin line curves. The beam position thus moves from the position between the electrodes 11A and 11B to another position between the electrodes 11B and 11C.

Thus, the beam position can be moved by keeping fixed the current to be supplied from a central one of a plurality of electrodes juxtaposed in parallel to each other while increasing and decreasing the electric currents to be supplied from the opposite adjacent electrodes to the central electrode in a similar manner. Whether the electrode width or the distance between the electrodes is great or small, the distance of movement of the beam position can be increased by increasing the number of electrodes.

Further, where a beam is formed by supplying electric currents from a large number of electrodes at a time, the profile of the beam can be controlled by controlling the electric currents to be supplied from the individual electrodes, and also the beam position can be moved.

The semiconductor laser device of the present invention can be applied not only to a tracking servo system but also as a laser light source for a laser printer or a like apparatus. In this instance, scanning in a sub scanning direction is performed by adjusting the current densities to be applied to the electrodes of the semiconductor laser while scanning of the laser beam in a main scanning direction is performed by mechanical scanning using a polygonal scanner or a like apparatus to effect scanning in the main scanning direction and the sub scanning direction simultaneously. In this instance, the electric currents to the semiconductor device may be applied intermittently. Further, the semiconductor laser device of the present invention can be applied to various laser measurement instruments.

Having now fully described the invention, it will be apparent to one of ordinary skill in the art that many changes and modifications can be made thereto without departing from the spirit and scope of the invention as set forth herein.

What is claimed is:

1. A semiconductor laser device, comprising:
   an active layer for oscillating a laser beam when an electric current is supplied thereto;
   a plurality of independent electrodes connected to the active layer, with each electrode receiving a corresponding continuously varying electric current; and
   means for supplying each said continuously varying electric current from said electrodes to said active layer to vary a density distribution of electric currents in the active layer and to vary an intensity distribution of the laser beam, thereby varying the location of the beam on an emergent face of said semiconductor laser device.

2. A semiconductor laser device according to claim 1, wherein said plurality of independent electrodes varies the current density distribution in said active layer in a lateral direction perpendicular to an emerging direction of laser light from said semiconductor laser device to vary the intensity distribution of the laser light in the lateral direction.

3. A semiconductor laser device according to claim 1, wherein said plurality of independent electrodes are formed as stripes extending in an emerging direction of laser light from said semiconductor device from a front end face to a rear end face of said semiconductor laser device.

4. A semiconductor laser device according to claim 1, wherein said semiconductor laser device emits only one laser beam.

5. The semiconductor laser device according to claim 1, comprising:
 a semiconductor substrate; and
 a plurality of semiconductor layers including a first clad layer of a first conduction type, the active layer, a second clad layer of a second conduction type and a contact layer of the second conduction type successively layered on said semiconductor substrate.

6. A driving method for a semiconductor laser device according to claim 5, comprising the step of supplying electric currents individually from said plurality of independent electrodes formed on said contact layer to vary the current density distribution in said active layer.

7. A driving method for a semiconductor laser device according to claim 6, comprising the steps of supplying electric currents individually from said electrodes so that a light emitting area in which the current density exhibits its maximum to oscillate a laser beam may be formed in said active layer, and continuously varying the electric currents to be supplied to said electrodes to continuously move the light emitting area to move the beam position of the laser beam in a lateral direction.

8. A driving method for a semiconductor laser device according to claim 7, wherein said semiconductor laser device emits only one laser beam.

9. A semiconductor laser device according to claim 5, wherein said plurality of independent electrodes are formed as stripes extending in the light emerging direction from a front end face to a rear end face of said semiconductor laser device.

10. A driving method for a semiconductor laser device according to claim 9, comprising the step of controlling the electric currents to be supplied from said striped electrodes to continuously vary the electric currents to be supplied from said electrodes from a condition wherein a laser beam is oscillated at a particular position to continuously move the beam position of the laser beam on the emergent face of said semiconductor laser device.

11. A driving method for a semiconductor laser device according to claim 9, comprising the steps of supplying an electric current from a first one of a pair of ones of said striped electrodes so that a laser beam is oscillated under the first electrode, and continuously decreasing the electric current to be supplied from said first electrode and simultaneously continuously increasing the electric current to be supplied from the second electrode adjacent the first electrode to continuously move the beam position of the laser light on the emergent face of said semiconductor laser device from below the first electrode to below the second electrode.

12. A driving method for a semiconductor laser device according to claim 9, comprising the steps of supplying equal electric currents from adjacent first and second ones of three ones of said striped electrodes to oscillate a laser beam below said first and second electrodes, and continuously decreasing the electric current to be supplied from the first electrode and simultaneously continuously increasing the electric current to be supplied from the third electrode adjacent the second electrode while keeping fixed the electric current to be supplied from the second electrode to continuously move the beam position of the laser beam on the emergent face of said semiconductor laser device from below the first and second electrodes to below the second and third electrodes.

13. A semiconductor laser device according to claim 5, wherein said semiconductor laser device emits only one laser beam.

14. The semiconductor laser device of claim 1, wherein said supplying means supplies said continuously varying electric currents such that the intensity distribution remains symmetrical while varying.

15. A tracking servo system, comprising:
 a laser source for generating a laser beam to be irradiated upon an optical disk which has information tracks stored in the form of optically detectable markers thereon;
 a beam direction apparatus for directing the laser beam from said laser source along a beam path to an object location of the optical disk which includes an object information track and a pair of non-recorded areas between the object information track and adjacent information tracks on the opposite sides of the object information track;
 an objective lens for converging the laser beam directed by said beam direction apparatus upon the object location of the optical disk and receiving the beam reflected from the object location;
 a photo-detector for receiving and converting the reflected beam into an electric signal; and
 a laser driving apparatus for controlling the electric current to be supplied to said laser source in response to the electric signal from said photo-detector;
 said laser source being a semiconductor device including an active layer for oscillating a laser beam when an electric current is supplied thereto, and a plurality of independent electrodes connected to the active layer, with each electrode receiving a corresponding continuously varying electric current and means for supplying each said continuously varying electric current from said electrodes to said active layer to vary a density distribution of electric currents in the active layer and to vary an intensity distribution of the laser beam, thereby varying the location of the beam on an emergent face of said semiconductor laser device.

16. A driving method for driving a semiconductor laser device, the method comprising:
 continuously varying a plurality of electric currents;
 supplying the continuously varying electric currents individually to a plurality of independent electrodes; and
 supplying the continuously varying electric currents from said electrodes to an active layer of the semiconductor laser device to move a beam emitting position on an emergent face of the semiconductor laser device.

* * * * *